United States Patent
Gauthier

[11] Patent Number: 6,132,515
[45] Date of Patent: Oct. 17, 2000

[54] LIQUID PRECURSOR DELIVERY SYSTEM

[75] Inventor: Scott Gauthier, San Jose, Calif.

[73] Assignee: Cosmos Factory, Inc., San Jose, Calif.

[21] Appl. No.: 09/324,233

[22] Filed: Jun. 2, 1999

Related U.S. Application Data

[62] Division of application No. 09/041,843, Mar. 12, 1998.

[51] Int. Cl.⁷ .................................................... C23C 16/00
[52] U.S. Cl. ........................................... 118/715; 118/726
[58] Field of Search ..................................... 118/715, 726

[56] References Cited

U.S. PATENT DOCUMENTS

| Re. 35,010 | 8/1995 | Price | 222/1 |
|---|---|---|---|
| 3,805,736 | 4/1974 | Foehring et al. | 118/715 |
| 5,054,650 | 10/1991 | Price | 222/1 |
| 5,091,219 | 2/1992 | Monkowski et al. | 427/255.5 |
| 5,098,741 | 3/1992 | Nolet et al. | 427/248.1 |
| 5,320,680 | 6/1994 | Learn et al. | 118/724 |
| 5,361,800 | 11/1994 | Ewing | 392/399 |
| 5,371,828 | 12/1994 | Ewing | 392/399 |
| 5,372,754 | 12/1994 | Ono | 261/142 |
| 5,421,895 | 6/1995 | Tsubouchi et al. | 118/726 |
| 5,437,542 | 8/1995 | Ewing | 417/258 |
| 5,510,146 | 4/1996 | Miyasaka | 427/255 |
| 5,620,524 | 4/1997 | Fan et al. | 118/726 |
| 5,630,878 | 5/1997 | Miyamoto et al. | 118/715 |
| 5,690,743 | 11/1997 | Murakami et al. | 118/715 |
| 5,730,804 | 3/1998 | Gomi et al. | 118/726 |
| 5,966,499 | 10/1999 | Hinkle et al. | 392/388 |
| 5,976,262 | 11/1999 | Sivaramakrishnan et al. | 118/726 |

OTHER PUBLICATIONS

Modeling of Low–Pressure Deposition of SiO2 by Decomposition of TEOS, IEEE Transactions on Electron Devices, vol. ED–26, No. 4, Apr. 1979.

Schumacher Chemicals and Precursors Product Literature: FTES, TDMAT, TDEAT, CuTMVS, Tomcats, Extrema Tomcats, Extrema Diethylsilane, TEB, Extrema TMB, Extrema TMPI, TEPO, Extrema TEOS, 1994.

*Primary Examiner*—Jeffrie R Lund
*Attorney, Agent, or Firm*—Ray K. Shahani, Esq.; David E. Newhouse, Esq.

[57] ABSTRACT

A system for delivering a liquid phase precursor fluid into a process chamber as a vapor phase fluid at constant pressure, the system comprising: a vaporizer for vaporizing the liquid phase precursor fluid prior to injecting the vapor phase fluid precursor into the process chamber, and a controllable device for transporting a preselected volume of the liquid phase fluid precursor from a reservoir to the vaporizer responsive to the pressure at the outlet of the vaporizer prior to entering the process chamber where the transport device is operated as the pressure at the outlet of the vaporizer canister drops, whereby system pressure perturbances are minimized prior to entering the process chamber.

9 Claims, 1 Drawing Sheet

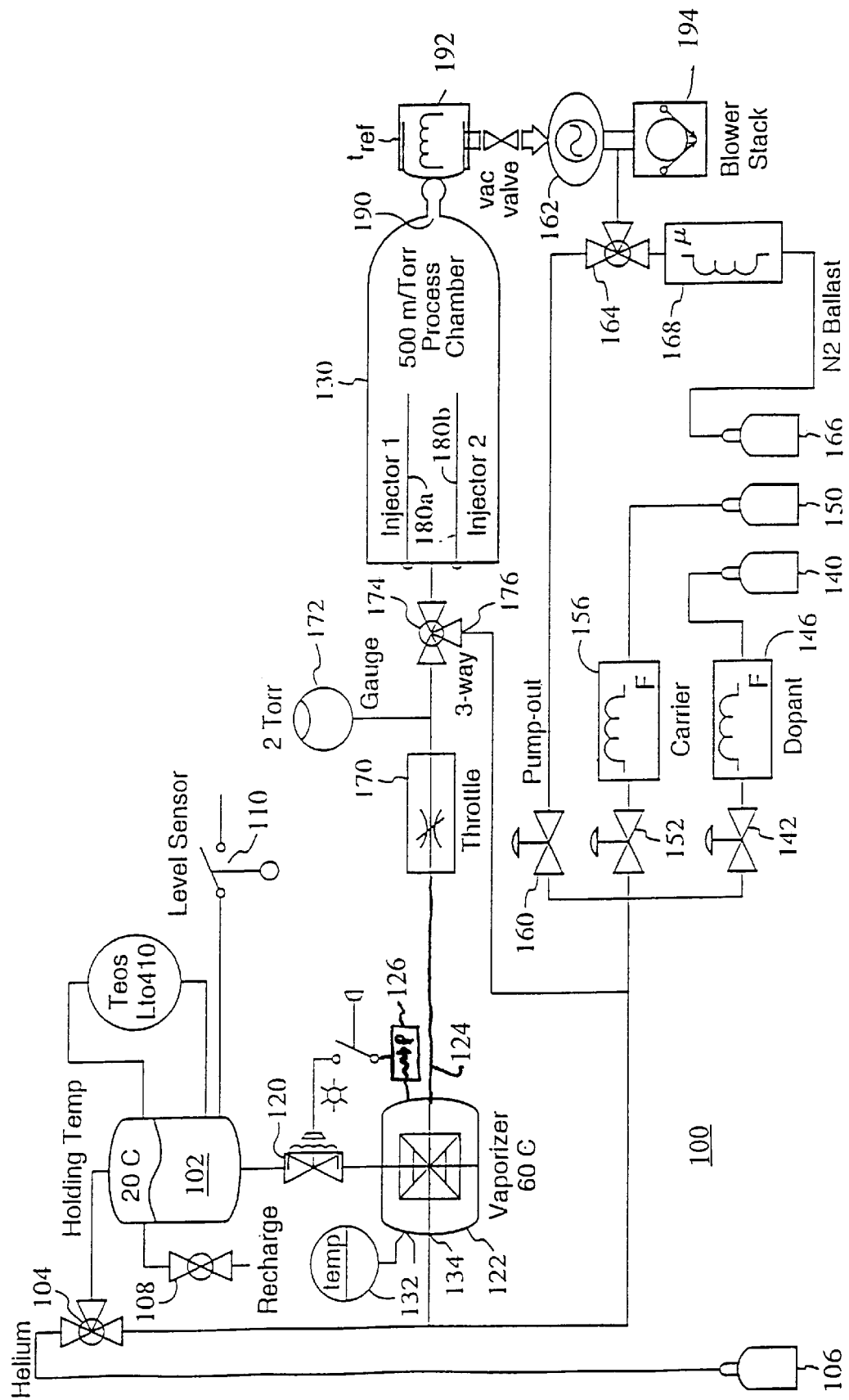

LIQUID PRECURSOR DELIVERY SYSTEM

RELATED APPLICATIONS

The Present application is a Divisional Application of co-pending U.S. patent application Ser. No. 09/041,843 filed Mar. 12, 1998.

FIELD OF THE INVENTION

The present invention relates to delivery of liquid phase precursor fluids for chemical vapor deposition (CVD) and similar mass transport processing operations typically used in the manufacture of semiconductor wafers.

More particularly, the invention relates to a method and apparatus for implementing dual proportional-integral-derivative (P.I.D) type servo control over output pressure and operating temperature, hence flow of a vapor phase precursor, by controlling input of a liquid precursor component and thermal energy to a vaporizer.

BACKGROUND OF THE INVENTION

Chemical vapor deposition (CVD) processes are typically utilized in production of integrated electronic semiconductor components in which numerous layers of various types of materials are deposited one layer at a time onto a Silicon or other semiconductor substrate wafer. In a typical CVD manufacturing process, round wafers of extremely pure silicon, germanium or other semiconductor substrate typically of a diameter between 2 and 12 inches, comprise a base onto which layers of conducting, semi-conducting and insulating materials are successively deposited. Gates and paths as well as circuit elements are etched into each successive layer, usually by photolithic and laser illumination processes. In this way the layers are interconnected forming an integrated array of electronic processing devices and circuits. Several dozen to several hundred identical individual integrated circuits/devises are typically simultaneously deposited onto a single wafer at a time. The deposited base wafer is then cut up into individual devices or "chips" either before or after they are electronically tested for detects. The individual chips are then incorporated into electronic devices, such as computer boards, toys, household electronics, automobile circuits, manufacturing equipment, commercial equipment, and the like.

The CVD process is typically described in terms of temperature-dependent phase change and nucleation/deposit phenomenon and typically involves reactions and commingling of one or two vapor phase fluids or gases in combination with a reactive surface. In many instances the source of the reactant gas is fluid in liquid phase which must be vaporized with minimum perturbation of vapor phase fluid pressure, temperature and volume parameters in the process or reaction vessel to achieve uniform, well formed layers of deposited materials. In other words, as in other precision manufacturing processes, limits and tolerances are narrow.

In the prior art, numerous designs for reaction chambers and parameters are described for achieving the rigorous operating conditions in chemical vapor deposition processes for depositing integrated semiconductor circuits. For example, U.S. Pat. No. 5,091,219 to Monkowski et al issued Feb. 25, 1992 describes a CVD process which requires specific geometries and flow patterns of the reactant gases within an essentially cylindrical reactor. This patent teaches that uniformity and control over layer deposition is accomplished by directing flow pattern of reactant gas through the reactor.

U.S. Pat. No. 5,098,741 to Nolet et al issued Mar. 24, 1992 teaches a method and system for delivering liquid reagents to processing vessels wherein a volume of liquid reagent is a metered to an expansion valve with an adjustable orifice which increases and decrease in diameter responsive to up stream of the liquid pressure. The liquid reagent flashes to vapor phase as it passes through to the downstream side of the expansion valve which typically is at a much lower pressure. Energy (heat) is supplied to the downstream side of the expansion valve, i.e., a vaporization chamber or vaporizer located upstream from the reactor vessel to provide necessary heat of vaporization to prevent fogging and droplet formation. The point of the adjustable orifice in the expansion valve is to minimize perturbations in the pressure of vapor phase reagent (mass flow rate) downstream of expansion valve due to inert gases dissolved in the liquid reagent upstream from the expansion valve.

U.S. Pat. No. 5,320,680 to Learn et al issued Jun. 14, 1994 teaches a primary flow CVD apparatus comprising gas preheater and a geometry promoting substantially eddy-free gas flow. This patent attempts to describe an operative reaction chamber with a hot wall reaction tube, and primary and secondary reaction gas preheaters vessels each with gas injectors directing heated gas into an annular mixing zone immediately upstream of the cylindrical reaction tube. The idea is that the reactant gases are preheated as they are injected into the annular mixing zone which because of its coaxial relationship with the reaction tube promotes highly laminar reactant gas flow through the tube perpendicular to the edges of wafers stacked in boats within the reaction tube. Preheating immediately upstream of the reaction tube and laminar flow perpendicular to stacked wafer edges is thought to reduce wafer contamination due to premature nucleation (particle formation) of the reactant gases, eddies and stagnant regions within the reaction tube volume. Learn et al doesn't discuss problems associated with a liquid phase source for the primary or secondary reactant gases.

U.S. Pat. Nos. 5,361,800, 5,371,628 and 5,437,542 issued November 8, Dec. 6, 1994 and Aug. 1, 1995, respectively, to Ewing describe direct liquid injection positive displacement liquid pump and vaporizer systems. The automated valve pumping systems use a pair of pumps operating in opposition to provide continuous and constant volumetric flow of liquid to a vaporizer using a stack of disks heated for flashing the liquid reagent to vapor the liquid.

U.S. Pat. No. 5,421,895 to Tsubouchi issued Jun. 6, 1995 et al teaches an apparatus for generating and then vaporizing small droplets of liquid phase reactant comprising a piezoelectric vibrator vibrating an open nozzle tip for ejecting a liquid droplets at ambient pressure into small pores through a heated plate into a vapor chamber maintained at substantially lower pressure.

U.S. Pat. No. 5,510,146 to Miyasaka issued Apr. 23, 1996 teaches a CVD apparatus and method of fabricating a thin-film semiconductor device. This low-pressure system produces a thin film forming a channel portion inside a reaction chamber in which the pressure is reduced at a specified rate at the commencement of the procedure.

U.S. Pat. No. 5,620,524 to Fan et al issued Apr. 15, 1997 teaches a system based upon a continuous delivery, micro metering pump pumping a liquid phase reagent fluid to provide a continuous flow pulse-free vapor phase reagent flow manner depends on the capacity and restrictive connection of the pump to its external environment, as well as the electronic control circuitry and control algorithms used to control the motion of the displacement elements of the pump.

However, an alternative approach to achieving a uniform, controllable and effective layer deposition on a substrate is to utilize a liquid precursor system with feedback control based on the pressure and temperature of the vaporized precursor relative to an initial stage vaporizer. The prior art does not teach the use of a controller for a liquid shot pump which receives an operating signal from a pressure transducer measuring the pressure of a temperature controlled front end vaporizer.

SUMMARY OF THE INVENTION

The present invention is a method and apparatus for forming a semiconductor layer by chemical vapor deposition of any liquid phase precursor material by vaporization of the liquid phase, and (optional) premixing with either or both carrier and dopant gases prior to injection into a process chamber where the wafers are deposited. The system uses a first temperature controlled liquid canister for containing the liquid phase precursor fluid and a second temperature controlled vapor canister for vaporizing the liquid phase precursor material. A liquid shot pump controlled by a signal produced in response to the pressure of the system measured by a manometer communicates liquid phase precursor material from the first liquid phase canister to the vapor phase canister as the pressure, which is constantly monitored, starts to drop due to the mixture of vapor phase precursor material and/or carrier gas and/or dopant gas being drawn off into the process tube or reactor. The vapor phase canister is temperature controlled at an optimum vaporization temperature level for the precursor.

Also connected to the vaporizer canister is a source of carrier and/or dopant gas and associated valves, for pre-homogenization of the gases before entering the reaction or process chamber. Mass flow controllers (MFCs) control flow of the various gases, including nitrogen or other purge system, for fast clearing of the entire gas system if necessary. Residual effluent gases are drawn off at the opposite end of the process tube and collected in a condensate trap to protect a vacuum system from contamination. Loading or filter burden is monitored through the use of pressure transducers or other sensors differentially compared and read by the main controller.

Thus, it is an advantage of the present invention to provide an apparatus and method for forming a uniform, electronically uniform, stable and other with applicable and advantageous characteristic, layer or film of semiconductor material by chemical vapor deposition.

It is another advantage of the present invention to provide an apparatus and method for forming such layer of semiconductor material by chemical vapor deposition in a low pressure reactor.

It is another advantage of the present invention to provide an apparatus and method for forming such layer of semiconductor material in which a liquid precursor material vaporizer canister is charged by a liquid precursor at a rate based on fluctuation in pressure at the outlet of the vaporizer, as implemented using a PID or other servo control scheme.

It is another advantage of the present invention to provide an apparatus and method for forming such layer of semiconductor material in which the liquid precursor material vaporizer canister is maintained constant at an optimum temperature.

Numerous other advantages and features of the present invention will become readily apparent from the following detailed description of the invention and the embodiment thereof, from the claims and from the accompanying drawings.

BRIEF DESCRIPTION OF THE DRAWINGS

FIG. 1 is a representative system diagram for forming a semiconductor film or layer by the apparatus and method of the present invention.

DETAILED DESCRIPTION OF THE PREFERRED EMBODIMENT

It will be understood that while numerous preferred embodiments of the present invention are presented herein, many of the individual elements and functional aspects of the embodiments are similar. Therefore, it will be understood that structural elements of the numerous apparatus disclosed herein having similar or identical function will have like reference numerals associated therewith.

FIG. 1 is a representative system 100 diagram for forming a semiconductor film or layer by the apparatus and method of the present invention. Liquid canister 102 is temperature controlled. An optimum temperature for holding liquid precursors is determined based on their relatively high cost and relatively low life at elevated temperatures, and can be selected randomly or based on other parameters as well. In a preferred embodiment, the temperature of the liquid precursor stored in canister 102 will be maintained between about 5 degrees Celsius and about 100 degrees Celsius, and more preferably at about 20 degrees Celsius or other temperature, and at any appropriate pressure, for preserving the precursor under conditions in which its shelf life is longest. Typically, reagent grade precursors are used, i.e. precursors having an ultra-high purity and suitable for the manufacture of semiconductor devices. Especially with regard to some liquid precursors, since their decay time is shorter at elevated temperatures, it is desirable to hold the typical liquid precursor materials at as low a temperature as possible relative to the temperature at which it is vaporized.

The nature of the liquid precursor material will depend on the type of process which is being performed in the process chamber 130. For CVD, diffusion and other processes, typical liquid precursor materials together with the corresponding solid phase material which is deposited on or diffused into a wafer are set forth in Table 1 as follows.

TABLE 1

| Liquid Reagent | Material Deposited |
| --- | --- |
| Trichlorosilane | Epitaxial silicon |
| Dichlorosilane | Epitaxial silicon |
| Tetraethylorthosilicate (TEOS) | $SiO_2$, phosphosilicate glass |
| Trimethylborate (TMB) | Borophosphosilicate glass |
| Trichloroethane | Oxide passivation |
| Boron tribromide | Boron diffusion |
| Phosphorous oxychloride | Phosphorous diffusion |
| Fluorotriethoxysilane (FTES) | SiOF films |
| Tetrakis-dimethylamino Titanium (TDMAT) | Titanium nitride films |
| Tetrakis-diethylamino Titanium (TDEAT) | Titanium nitride films |
| CuTMVS | Copper films |
| Trimethylcyclotetrasiloxane (TOMCATS) | $SiO_2$ films |
| Diethylsilane | $SiO_2$ films |
| Triethylborate (TEB) | Borosilicate glass and borophosphosilicate glass |
| Trimethyl Phosphite (TMPI) | Liquid phosphorous for $SiO_2$ doping |
| Triethylphosphate (TEPO) | Liquid phosphorous for $SiO_2$ doping |

A three way valve 104 is connected to liquid canister 102. In one position, helium from helium storage container 106 flows into storage container 102 for maintaining positive pressure therein. In a preferred embodiment, helium from storage tank 106 pressurizes liquid canister 102 through the normally open channel of the three way valve 104. Upon depletion of an initial charge of liquid precursor, liquid canister 102 can be recharged by closing the open channel through three way valve 104 from helium tank 106 to liquid canister 102 and opening the closed channel. This negatively pressurizes the liquid canister 102. By attaching a recharge vessel (not shown) to recharge valve 108 and opening said valve, a volume of liquid precursor will flow through recharge valve 108 into liquid canister 102. Thereafter, once the canister 102 has been recharged, the recharge valve 108 can be closed and the three way valve 104 switched to repressurize the canister 102 with helium or other carrier or purge gas. Thus, utilizing a level sensor 110 or other means for determining remaining volume of liquid precursor in liquid canister 102, the canister can be automatically or manually refilled and the system 100 operated essentially continuously.

Shot pump 120 communicates liquid precursor to vaporizer canister 122. The shot pump 120 is controlled in a feedback loop control system in which the pressure of the output 124 of vaporizer 122 is measured using manometer 126. As the vaporized liquid precursors, carrier gases and/or dopant gases are drawn out of the vaporizer 122 into process chamber 130, the resultant drop in pressure will trigger the shot pump 120. Preferred embodiments of the shot pump of the present invention have an orifice diameter about 0.001 inches and about 0.5 inches, and more preferably about 0.040 inches. Such shot pumps are also known as "biosolenoids", and are similar to those used in processes such as gas and/or high pressure liquid chromatography. Typically, such shot pumps 120 or bio-solenoid valves will have a Teflon or other resilient, polymeric insert for providing a high repetition pulse rate.

In a preferred embodiment, the vaporizer 122 is maintained between about 500 Torr and about 0.5 Torr, and more preferably at about 8 Torr. Vaporizer canister 122 will be temperature controlled by controller 132 and maintained at the optimum vaporization temperature for the precursor, such as between about 5 degrees Celsius and about 100 degrees Celsius, and more preferable at about 60 degrees Celsius or other temperature. This temperature in conjunction with the reduced pressure of the vaporizer 122 will result in rapid vaporization of the liquid precursor or precursors introduced into the canister. Another port 134 allows the introduction of a carrier gas, dopant, or other fluid into the vaporizer 122. This introduction of carrier gases, dopants or other fluids into the vaporizer 122 rather than directly into the process chamber 130 pre-homogenizes the gases, along with the vaporized liquid precursor or precursors, so as to develop a uniform and evenly dispersed gas mixture within vaporizer 122.

Additional gas and/or fluid transport systems are part of the present system 100. In a preferred embodiment, the liquid precursor system uses a dopant gas which is maintained in dopant reservoir 140 and a carrier gas or fluid maintained in carrier reservoir 150. Dopant is delivered through valve 142 as controlled by mass flow controller 146. Carrier gas or fluid is delivered to the system through valve 152 as controlled by mass flow controller 156. An additional valve 160 can be used for pumping out the system with vacuum source 162 through three way valve 164, and also for purging the system 100 such as with nitrogen gas from nitrogen storage tank 166 through mass flow controller 168. Dopants include boron, phosphine and other compounds, such as those used for P-N doping, etc.

Between the process chamber 130 and the manometer 126 at the outlet 124 of the vaporizer 122 there is a restriction or other pressure reducing valve (PRV) 170. Gauge 172 provides a means for determining the pressure within the system at that stage, i.e. prior to another three-way valve 174. Flow through valve 174 is therefore either by liquid precursor downstream of PRV 170 or by other gas or fluid from input 176. Flow out of valve 174 is directed into one or two or more injectors, such as 180*a* and 180*b*, etc., within a process chamber 130. Pressure within the process chamber 130 will, in preferred embodiments, be reduced, such as to between about 50 mTorr and about 500 Torr, and more preferably about 500 mTorr. The temperature of the process chamber will, in preferred embodiments, be elevated to between about 25 degrees Celsius and about 500 degrees Celsius, and more preferably to about 250 degrees Celsius.

It will be understood that any of various different embodiment of the reaction or process chamber 130 will be known to those skilled in the art. In particular, specific configurations and systems are known for automated or assisted handling of wafer stacks in and out of the process chamber, and will be included within the scope of the present invention. In particular applications, wafers are stacked onto "boats" or support trays through which the gases injected into the process chamber 130 can circulate in the preferred flow character.

Residual effluent gases are drawn out of the process chamber 130 at a distal end 190, and through condensate trap 192. This trap 192 protects the vacuum system from contamination. Across both the inlet and the outlet of the trap 192 are pressure transducers. Differential comparison of the signals from such transducers are determined and read by a main controller. When a specific setpoint or other predetermined level of loading across the trap 192 is determined, the system controller can send an alarm to instruct an operator to change or otherwise regenerate the trap 192. The vacuum source 162 with its associated blower stack 194 provides a way to pump out any and/or all of the various channels.

Integral to the present invention is the control scheme or algorithm used to servo the shot pump controller based upon the pressure at the outlet of the vaporizer. In preferred embodiments, a PID controller with a vaporizer outlet pressure setpoint is used. In a preferred embodiment, a dual PID controller with individual set points and corresponding gains for temperature and pressure both can be used. Variable gain controllers are used in preferred embodiments of the present invention.

The system of the present invention is unique also in the pressure buffering which is possible. Liquid precursor is injected into a vaporizer at a rate so as to maintain an outlet pressure of at least about 8 Torr. The pressure of the gas is throttled down to about 2 Torr, at which point it is injected into the reaction or process chamber 130 which is maintained at or about 500 mTorr. The nitrogen dump and/or ballast can be used to control pressure throughout the system 100. This unique pressure buffering scheme is advantageous for providing non-variable, uniform, homogeneous and well defined semiconductor layers, as desired. The pressure control scheme enhances pumpdown, purge, cleaning and evacuation procedures to pressures as low as 50 mTorr.

Unless defined otherwise, all technical and scientific terms used herein have the same meaning as commonly understood by one of ordinary skill in the art to which this invention belongs. Although any methods and materials similar or equivalent to those described can be used in the practice or testing of the present invention, the preferred methods and materials are now described. All publications and patent documents referenced in this application are incorporated herein be reference.

While the principles of the invention have been made clear in illustrative embodiments, there will be immediately obvious to those skilled in the art many modifications of structure, arrangement, proportions, the elements, materials, and components used in the practice of the invention, and otherwise, which are particularly adapted to specific environments and operative requirements without departing from those principles. The appended claims are intended to cover and embrace any and all such modifications, with the limits only of the true purview, spirit and scope of the invention.

I claim:

1. A system for delivering a liquid phase precursor material to a process chamber in which the precursor material exists in at least a vapor form, the system comprising:

a vaporizer canister having an outlet coupled fluidically to the process chamber for vaporizing the liquid precursor material prior to injection into the process chamber;

a pressure sensing device coupled to the vapor canister sensing the pressure of the vapor canister for providing an output signal representative of the system pressure; and controllable means receiving the output signal from the pressure sensing device for transporting a preselected volume of the liquid precursor material in the liquid phase from a reservoir thereof to the vaporizer canister in response to variation of system pressure of the vaporizer canister, whereby system pressure perturbances are minimized prior to entering the process chamber.

2. The system of claim 1 in which the vaporizer canister vaporizes a sufficient amount of liquid precursor to maintain the pressure of the system prior to entering the process chamber between about 500 Torr and about 500 mTorr.

3. The system of claim 1 in which the vaporizer canister vaporizes a sufficient amount of liquid precursor to maintain the pressure of the system prior to entering the process chamber at about 8 Torr.

4. The system of claim 1 in which the process chamber is maintained at between about 500 Torr and about 50 mTorr.

5. The system of claim 1 in which the process chamber is maintained at about 500 mTorr.

6. The system of claim 1 in which the controllable means of transporting the liquid precursor material is a shot pump.

7. The system of claim 1 in which the controllable means of transporting the liquid precursor material is a positive displacement metering pump.

8. The system of claim 1 in which the controllable means of transporting the liquid precursor material comprises a pressure transducer and controller.

9. The system of claim 8 in which the controller is a proportional-integral-derivative type controller.

* * * * *